(12) United States Patent
Gupta et al.

(10) Patent No.: US 8,189,408 B2
(45) Date of Patent: May 29, 2012

(54) MEMORY DEVICE HAVING SHIFTING CAPABILITY AND METHOD THEREOF

(75) Inventors: Ravi Gupta, Austin, TX (US); David R. Bearden, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 268 days.

(21) Appl. No.: 12/620,314

(22) Filed: Nov. 17, 2009

(65) Prior Publication Data

US 2011/0116328 A1  May 19, 2011

(51) Int. Cl.
*G11C 7/00* (2006.01)

(52) U.S. Cl. .......... 365/189.12; 365/189.17; 365/230.05

(58) Field of Classification Search ............. 365/189.12, 365/189.17, 230.05
See application file for complete search history.

(56) References Cited

U.S. PATENT DOCUMENTS

| | | | |
|---|---|---|---|
| 5,305,399 A * | 4/1994 | Allen et al. ................... | 382/234 |
| 5,602,780 A | 2/1997 | Diem et al. | |
| 5,612,964 A | 3/1997 | Haraszti | |
| 5,889,791 A | 3/1999 | Yang | |
| 5,914,910 A * | 6/1999 | Mori ......................... | 365/230.06 |
| 6,105,106 A | 8/2000 | Manning | |
| 6,151,690 A | 11/2000 | Peeters | |
| 6,181,632 B1 * | 1/2001 | Kondo et al. ............. | 365/230.03 |
| 6,192,493 B1 | 2/2001 | Combelles et al. | |
| 6,525,973 B1 | 2/2003 | Shokouhi et al. | |
| 6,552,319 B2 * | 4/2003 | Pyyhtia et al. ............. | 250/208.1 |
| 7,013,412 B2 | 3/2006 | Becker et al. | |
| 7,039,069 B2 | 5/2006 | Hayashi | |
| 7,146,545 B2 | 12/2006 | Ohbuchi et al. | |
| 7,187,708 B1 | 3/2007 | Shiu et al. | |
| 7,191,369 B2 | 3/2007 | Kawahara et al. | |
| 7,502,390 B2 | 3/2009 | Lu et al. | |
| 2006/0218341 A1 * | 9/2006 | Nolte et al. ................... | 711/109 |
| 2008/0162824 A1 | 7/2008 | Jalowiecki et al. | |

OTHER PUBLICATIONS

Motorola Semiconductor Technical Data, MC14094B, Motorola CMOS Logic Data Manual, Motorola, Inc. 1991, pp. 6-170 to 6-173.
PCT/US2010/049958 International Search Report mailed May 13, 2011.

* cited by examiner

*Primary Examiner* — Hoai V Ho

(57) ABSTRACT

An array of memory bit cells are operable to provide a memory device having data shifting capability, so that data can be flexibly stored and retrieved from the memory device in both parallel and serial fashions. The memory array can thus be used for conventional memory storage operations, and also for operations, such as matrix operations, that provide for the alteration of the arrangement of stored data elements.

20 Claims, 9 Drawing Sheets

US 8,189,408 B2

MEMORY DEVICE HAVING SHIFTING CAPABILITY AND METHOD THEREOF

FIELD OF THE DISCLOSURE

The present disclosure is related generally to memory devices and methods.

BACKGROUND

In some data processing applications, it is desirable to reorganize stored data elements. For example, digital signal processing applications can reorganize data elements to more efficiently perform matrix manipulations, while communications applications can perform interleaving or de-interleaving of data elements. Some data processing devices implement one or more of these applications by employing dedicated hardware to perform data reorganization.

BRIEF DESCRIPTION OF THE DRAWINGS

The present disclosure may be better understood, and its numerous features and advantages made apparent to those skilled in the art by referencing the accompanying drawings.

DETAILED DESCRIPTION

In one aspect of the present disclosure, an array of memory bit cells are operable to provide a memory device having data shifting capability, so that data can be flexibly stored and retrieved from the memory device in both parallel and serial fashions. Thus, in one aspect a plurality of bits of data information can be stored at the set of bit cells in a parallel operation and retrieved from the bit cell array in a serial manner using a shifting operation. In another aspect, bits of data information can be stored at a bit cell array in a serial operation and accessed in a parallel operation. In still another aspect, bits of data information can be both stored at the bit cell array in a serial operation and also can be stored and retrieved in a parallel operation. The memory array can thus be used for conventional memory storage operations, and also for operations, such as matrix operations, that provide for the alteration of the arrangement of stored data elements.

Figure 1:
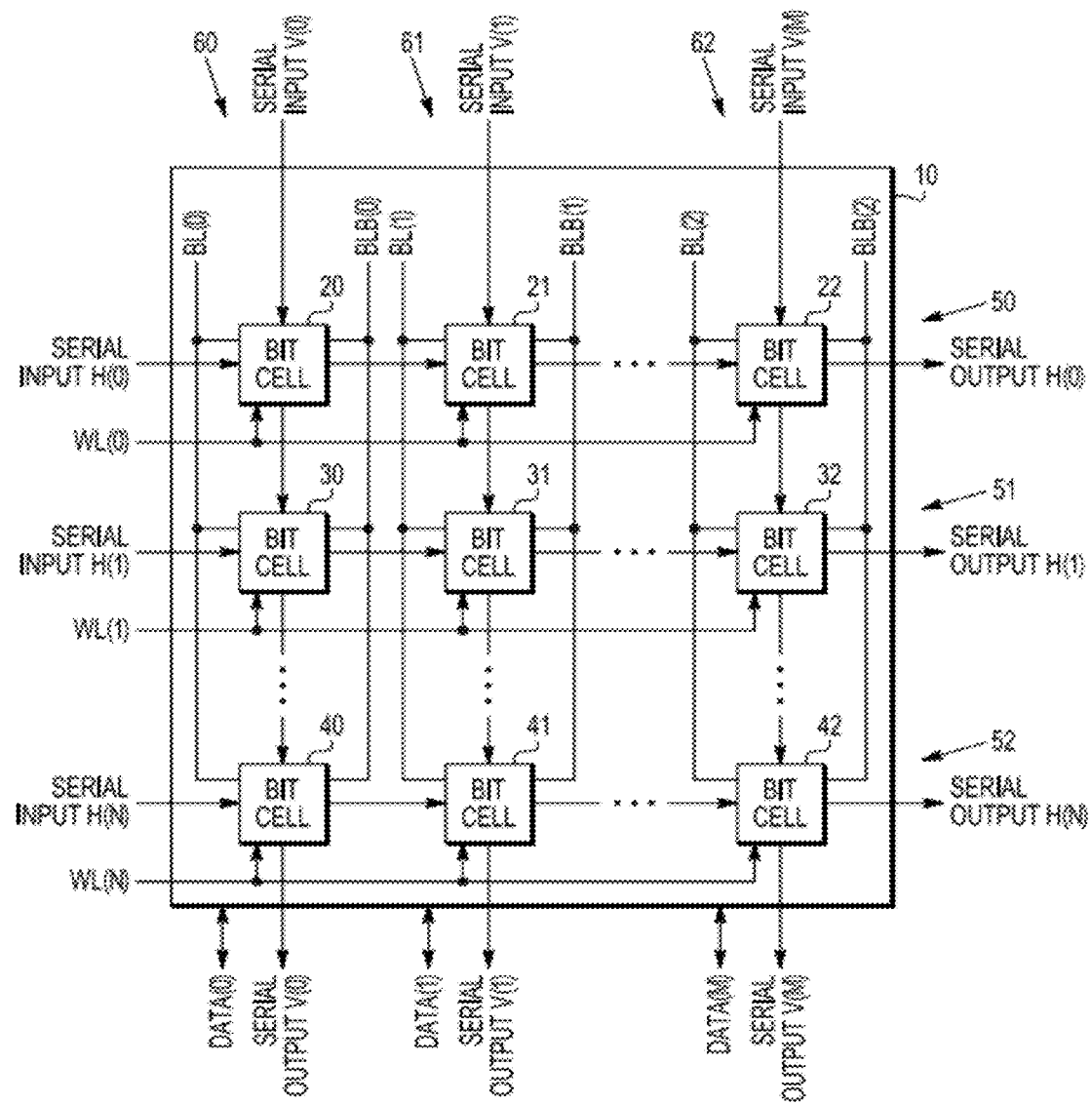
FIG. 1 is a block diagram illustrating a memory device including a bit cell array having shifting capability in accordance with a specific embodiment of the present disclosure.

FIG. 1 is a block diagram illustrating a memory device 100 including bit cell array 10 having shifting capability in accordance with a specific embodiment of the present disclosure. Bit cell array 10 includes bit cells arranged in an orthogonal array including illustrated bit cells 20, 21, 22, 30, 31, 32, 40, 41, and 42. Bit cell array 10 includes a plurality of rows and columns, including rows 50, 51, and 52, and columns 60, 61, and 62. It will be appreciated that although only three rows and three columns are illustrated, the bit cell array 10 can include any number of rows and columns. For example, in one embodiment, bit cell array 10 can include sixty-four bit cells arrayed as eight columns and eight rows.

Bit cells 20, 21 and 22 of row 50 are connected to a word line labeled WL(0), bit cells 30, 31 and 32 of row 51 are connected to a word line labeled WL(1), and bit cells 40, 41 and 42 of row 52 are connected to a word line labeled WL(N). Bit cells 20, 30 and 40 of column 60 are connected to bit lines labeled BL(0) and BLB(0), bit cells 21, 31 and 41 of column 61 are connected to bit lines labeled BL(1) and BLB(1), and bit cells 22, 32 and 42 of column 62 are connected to bit lines labeled BL(M) and BLB(M). Furthermore, each bit cell is connected to the bit cells that are immediately adjacent, both horizontally (in the word line direction), and vertically (in the bit line direction). For example, bit cell 20 is connected to bit cell 21 and to bit cell 30.

Each row and each column of bit cell array has an input to receive data that can be shifted into bit cell array 10 in a serial manner, and an output to shift data out of bit cell array 10 in a serial manner. Bit cell 20 has an input connected to a node labeled SERIAL INPUT H(0), and bit cell 22 has an output connected to a node labeled SERIAL OUTPUT H(0). Bit cell 30 has an input connected to a node labeled SERIAL INPUT H(1), and bit cell 32 has an output connected to a node labeled SERIAL OUTPUT H(1). Bit cell 40 has an input connected to a node labeled SERIAL INPUT H(N), and bit cell 42 has an output connected to a node labeled SERIAL OUTPUT H(N). Bit cell 20 has an input connected to a node labeled SERIAL INPUT V(0), and bit cell 40 has an output connected to a node labeled SERIAL OUTPUT V(0). Bit cell 21 has an input connected to a node labeled SERIAL INPUT V(1), and bit cell 41 has an output connected to a node labeled SERIAL OUTPUT V(1). Bit cell 22 has an input connected to a node labeled SERIAL INPUT V(M), and bit cell 42 has an output connected to a node labeled SERIAL OUTPUT V(M).

Memory device 100 can include one or more address decoders, word line drivers, bit line precharge devices, column selection circuits, or sense amplifier circuits (not shown at FIG. 1) to provide parallel data access to bit cells of a row of the bit cell array 10. For example, in an embodiment, each bit cell is associated with an address. In response to receiving an address at the memory device 100, a plurality of bits of data information can be stored or retrieved from the bit cells associated with the address. In particular, data can be stored or retrieved at the bit cells via data lines DATA(0-M) by suitably configuring word lines WL(0-N) and bit lines BL(0-M) and BLB(0-M) (referred to herein as a parallel access). Furthermore, data information can be accessed in a serial manner, wherein one or more bits of data information can be individually shifted into or out of bit cell array 10, and shifted between adjacent bit cells in a row or column. Thus, data information can be shifted horizontally in the word line direction or vertically in the bit line direction.

To illustrate, during operation, data information can be shifted into bit cells at row 50 via node SERIAL INPUT H(0) wherein a bit of data information is stored at bit cell 20 and the bit of data information previously stored at each additional bit cell located at row 50 is shifted into the next adjacent bit cell of row 50. In a similar manner, data information can be shifted out of bit cell 22 at row 50 via SERIAL OUTPUT H(0). Furthermore, data information can be shifted into bit cells at column 60 via node SERIAL INPUT V(0) wherein a bit of data information is stored at bit cell 20 and the bit of data information previously stored at each additional bit cell at column 60 is shifted into the next adjacent bit cell at column 60. In a similar manner, data information can be shifted out of bit cell 40 at column 60 via SERIAL OUTPUT V(0). Data information can be shifted into and out of rows 51 and 52, and columns 61 and 62 in the same way as just described. Information is thus shifted between subsets of bit cells of the bit cell array 10, with the data stored in a first subset of bit cells prior to a shift operation, then shifted to the second subset of bit cells by the shift operation. The second subset of bit cells can include some of the same bit cells as the first subset. For example, for a shift operation that shifts stored information by a single bit cell, the second subset of bit cells will include all but one bit cell of the first subset.

Data information can be shifted at more than one row or more than one column simultaneously. For example, two streams of serial data information can be shifted into and/or out of row 50 and row 51 of bit cell array 10 simultaneously. In one embodiment, multiple rows or columns of bit cell array 10 can be interconnected in a daisy-chain manner. For example, node SERIAL OUTPUT H(0) can be connected to node SERIAL INPUT H(1) to enable bit cell array 10 to store a stream of data that includes more bits of data information than the number of bit cells included at a single row of bit cell array 10.

Memory device 100 can be used to manipulate data and provide functionality that is generally implemented using multiple combinatorial logic blocks. For example, memory device 100 can be used to implement a parallel to serial converter, a serial to parallel converter, to perform matrix transformations, to provide data interleaving and de-interleaving operations, and the like. The flexibility of the memory device 100 reduces the need for separate hardware dedicated to each manipulation function, thereby reducing the size and cost of a data processing device incorporating memory device 100.

Figure 2:
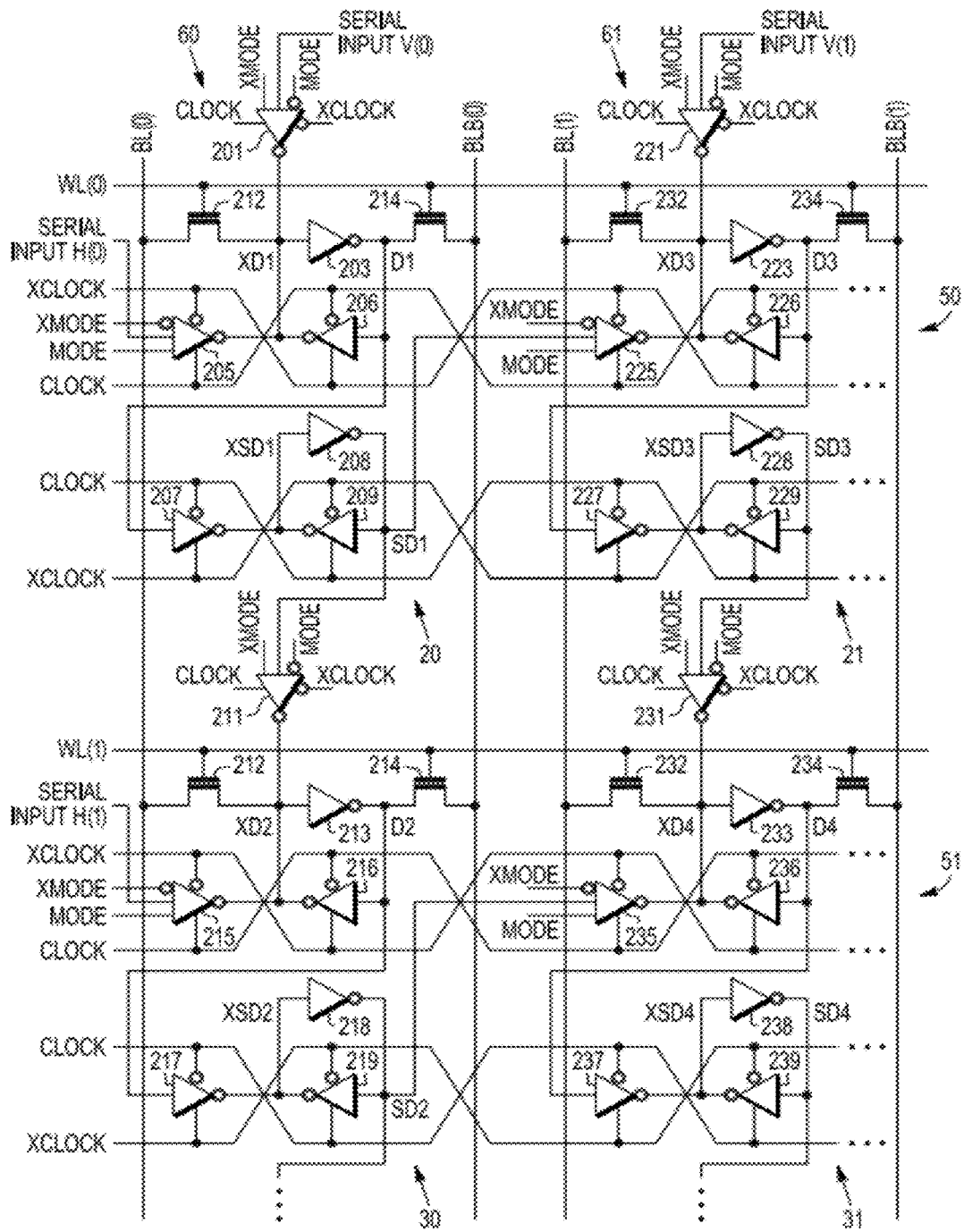
FIG. 2 is a schematic diagram illustrating a portion of the bit cell array of FIG. 1 in accordance with a specific embodiment of the present disclosure.

The operation of bit cell array 10 can be better understood with reference to FIG. 2. FIG. 2 is a schematic diagram illustrating a portion 200 of bit cell array 10 of FIG. 1 in accordance with a specific embodiment of the present disclosure. Portion 200 includes bit cells 20, 21, 30, and 31. The bit cells are arranged in an orthogonal manner to provide rows 50 and 51, and columns 60 and 61.

Bit cell 20 includes tri-state inverters 201, 205, 206, 207, and 209, inverters 203 and 208, and transistors 202 and 204. Bit cell 21 includes tri-state inverters 221, 225, 226, 227 and 229, inverters 223 and 228, and transistors 222 and 224. Bit cell 30 includes tri-state inverters 211, 215, 216, 217 and 219, inverters 213 and 218, and transistors 212 and 214. Bit cell 31 includes tri-state inverters 231, 235, 236, 237, and 239, inverters 233 and 238, and transistors 232 and 234. The transistors illustrated at FIG. 2 are n-channel field-effect transistors, but another type of transistor and process technology can be used without departing from the scope of the present disclosure. Each bit cell includes a master latch and a slave latch. For example, inverter 203 and tri-state inverter 206 implement a master latch circuit, and inverter 208 and tri-state inverter 209 implement a slave latch circuit.

Tri-state inverter 201 has an active-low tri-state enable input connected to a node labeled MODE, a data input connected to a node labeled SERIAL INPUT V(0), an active-high tri-state enable input connected to a node labeled XMODE, an active-low tri-state enable input connected to a node labeled XCLOCK, an active-high tri-state enable input connected to a node labeled CLOCK, and an inverting output connected to a node labeled XD1. Transistor 202 has a first current electrode connected to a node labeled BL(0), a control electrode connected to a node labeled WL(0), and a second current electrode connected to node XD1. Inverter 203 has an input connected to node XD1 and an output connected to a node labeled D1. Transistor 204 has a first current electrode connected to node labeled BLB(0), a control electrode connected to a node labeled WL(0), and a second current electrode connected to node D1. Tri-state inverter 205 has an active-low tri-state enable input connected to a node labeled XMODE, a data input connected to a node labeled SERIAL INPUT H(0), an active-high tri-state enable input connected to a node labeled MODE, an active-low tri-state enable input connected to a node labeled XCLOCK, an active-high tri-state enable input connected to a node labeled CLOCK, and an inverting output connected to a node labeled XD1. Tri-state inverter 206 has a data input connected to node D1, an active-low tri-state enable input connected to node CLOCK, and an active-high tri-state enable input connected to node XCLOCK.

Tri-state inverter 207 has a data input connected to node D1, an active-high tri-state enable input connected to node XCLOCK, an active-low tri-state enable input connected to node CLOCK, and an inverting output connected to a node labeled XSD1. Inverter 208 has an input connected to node XSD1 and an output connected to node SD1. Tri-state inverter 209 has a data input connected to node SD1, an active-high tri-state enable input connected to node CLOCK, an active-low tri-state enable input connected to node XCLOCK, and an inverting output connected to a node labeled XSD1.

Components of bit cells 21, 30, and 31 are connected in a similar manner as described with reference to bit cell 20, but with exclusive combinations of input values, bit lines, and word lines. For example, bit cells 20 and 21 share word line WL(0) (row 50) and bit cells 30 and 31 share word line WL(1) (row 51). Bit cells 20 and 30 share bit lines BL(0) and BLB(0) (column 60), and bit cells 21 and 31 share bit lines BL(1) and BLB(1) (column 61. Whereas bit cell 20 can receive data information via node SERIAL INPUT H(1), bit cell 21 can receive data information shifted out of bit cell 20. The operation of bit cells 20, 21, 30, and 31 are described with reference to bit cell 20.

Inverter 203 and tri-state inverter 206 form a master latch circuit, and inverter 208 and tri-state inverter 209 form a slave latch circuit. During operation, information can be stored at the master latch circuit using one of three methods: 1) parallel access; 2) serial row access (shifting horizontally to the right in the word line direction when signal MODE is asserted); and 3) serial column access (shifting vertically towards the bottom in the bit line direction when signal MODE is negated). For simplicity, the name of a node and the signal conducted at that node are used synonymously. For example, node WL(0) can conduct a signal WL(0).

Bit cells 20 and 21 can be accessed in parallel by asserting word line signal WL(0). For example, data information can be stored at bit cell 20 by providing the desired value to be stored at node BL(0) and the inverse of that value at node BLB(0).

Note that bit line pairs, such as BL(0) and BLB(0) are logically inverted (complement pairs) and nodes BL(0) and BLB(0) correspond to signal BL(0) of FIG. 1. The value stored at bit cell 20 can be retrieved by asserting word line signal WL(0) and sensing voltage signals received at nodes BL(0) and BLB(0). In the illustrated embodiment, signal CLOCK is asserted and signal XCLOCK is negated during a parallel access. In this embodiment, during a parallel access, one of tri-state inverters 205 and 206 drives node D1 via inverter 203, while the other is placed in a tri-state condition. During the parallel access, the voltages provided via the bit lines BL(0) and BLB(0) are of a sufficient magnitude that the state of the bit cell 20 is set by the bit line voltages, rather than the voltage driven by the tri-state inverters 205 and 206. In another embodiment, during a parallel access both tri-state inverters 205 and 206 are placed in a tri-state condition, so that they do not drive a voltage at node D1. Accordingly, the state of the bit cell during a parallel access will be set by the voltages provided on the bit lines BL(0) and BLB(0).

Data information can be shifted into bit cell 20 from node SERIAL INPUT H(0) (and the value stored at bit cell 20 shifted horizontally substantially simultaneously to bit cell 21) by asserting signal MODE, negating signal XMODE, asserting signal CLOCK and negating signal XCLOCK at tri-state inverter 205. Data information can also be shifted into bit cell 20 from node SERIAL INPUT V(0) (and the value stored at bit cell 20 shifted vertically substantially simultaneously to bit cell 30) by asserting signal XMODE, negating signal MODE, asserting signal CLOCK and negating signal XCLOCK at tri-state inverter 201. When signal CLOCK is negated and signal XCLOCK is asserted, tri-state inverter 206 refreshes the value stored at the master latch node XD1. At substantially the same time that the master latch is being refreshed, the output of tri-state inverter 207 is activated, which updates the slave latch of bit cell 20 with the same value stored at the master latch. When signal XCLOCK is negated and signal CLOCK is asserted, tri-state inverter 209 refreshes the value stored at the slave latch node XSD1.

The operation of bit cell 21, 30, and 31 is similar to that described with reference to bit cell 20, but bit cell 21 can receive data information from the slave latch portion of bit cell 20 or from node SERIAL INPUT V(1), bit cell 30 can receive data information from node SERIAL INPUT H(1) or from the slave latch portion of bit cell 20, and bit cell 31 can receive data information from the slave latch portion of bit cell 30 and the slave latch portion of bit cell 21.

Figure 3:
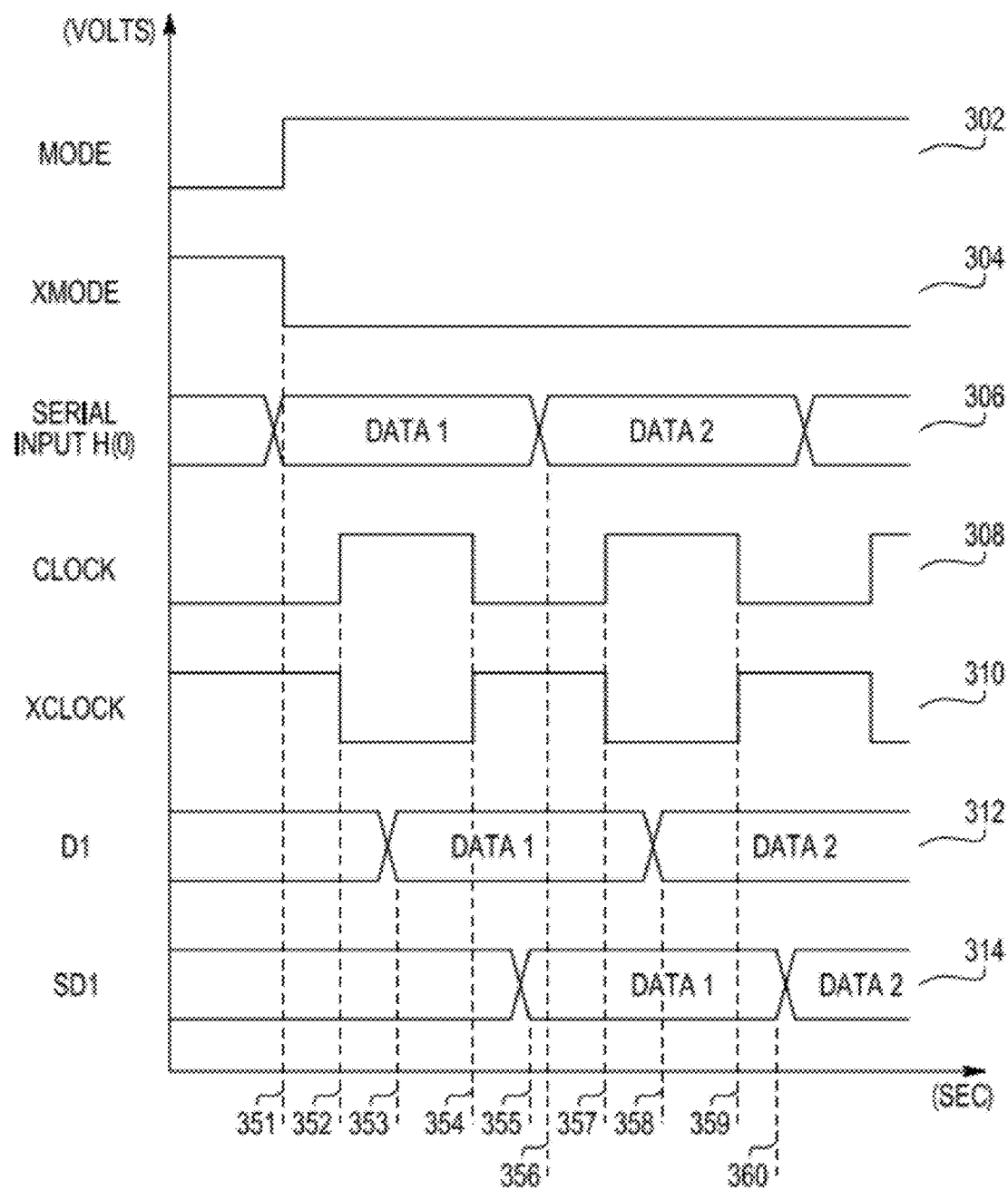
FIG. 3 is a timing diagram illustrating the operation of the bit cell array of FIG. 2 in accordance with a specific embodiment of the present disclosure.

FIG. 3 is a timing diagram 300 illustrating the operation of bit cell array 200 of FIG. 2 in accordance with a specific embodiment of the present disclosure. Timing diagram 300 includes a horizontal axis representing time in seconds, and a horizontal axis representing signal levels in volts. Timing diagram 300 includes a waveform 302 representing signal MODE, a waveform 304 representing signal XMODE, a waveform 306 representing signal SERIAL INPUT H(0), a waveform 308 representing signal CLOCK, a waveform 310 representing signal XCLOCK, a waveform 312 representing signal D1, and a waveform 314 representing signal SD1. Timing diagram 300 also includes time references 351, 352, 353, 354, 355, 356, 357, 358, 359, and 360.

Timing diagram 300 illustrates sequentially shifting two bits of data information into bit cells 20 and 21 at row 50 of bit cell array 200. Signal MODE transitions to a logic high level and signal XMODE transitions to a logic low level at time 351. Signal SERIAL INPUT H(0) also transitions at time 351 to a value labeled DAT1 (representing a single bit of binary data information having a value of one or a value of zero). At time 352, signal CLOCK transitions to a logic high level and signal XCLOCK transitions to a logic low level. The output of tri-state inverter 205 is thus enabled to drive node XD1 with a signal that is the inverse of the value of DAT1. At time 353, this signal has propagated to node D1. At time 354, signal CLOCK transitions to a logic low level and signal XCLOCK transitions to a logic high level, which enables tri-state inverter 206 to refresh node XD1 and enables tri-state inverter 207 to update node XSD1 of the slave latch of bit cell 20. At time 355, this signal has propagated to node SD1. Thus, at time 355, the value DAT1 is stored at the master latch and at the slave latch of bit cell 20.

Signal SERIAL INPUT H(0) transitions at time 356 to a value labeled DATA2. At time reference 357, signal CLOCK transitions to a logic high level and signal XCLOCK transitions to a logic low level. The output of tri-state inverter 205 is thus enabled to drive node XD1 with a signal that is the inverse of the value of DATA2. At time 358, this signal has propagated to node D1. At time 359, signal CLOCK transitions to a logic low level and signal XCLOCK transitions to a logic high level, which enables tri-state inverter 206 to refresh node XD1 and enables tri-state inverter 207 to update node XSD1 of the slave latch portion of bit cell 20. At time 360, this signal has propagated to node SD1.

At substantially the same time that bit cell 20 is updated, bit cell 21 is also updated with the data information previously stored at bit cell 20. For example, at time 358, the master latch of bit cell 21 (node D3) is updated with a value of DAT1. Thus, at time 360, the value DATA2 is stored at the master latch and the slave latch of bit cell 20 and the value DAT1 is stored at the master latch and the slave latch of bit cell 21. Additional data information can be shifted into bit cell 20 with successive transitions of signal CLOCK, while data information stored at other bit cells of row 50 is shifted to the next adjacent bit cell. Note that the data information shifted into row 50 of bit cell array 200 can eventually propagate to the end of row 50, where it can be shifted out of array 200 at node SERIAL OUTPUT H(0).

In an embodiment, the bit cells included at bit cell array 200 can be modified to provide only horizontal shift capability or only vertical shift capability. For example, if tri-state inverters 201, 211, 221 and 231 and signals MODE and XMODE are omitted, data information can be shifted in only the horizontal direction. Similarly, if tri-state inverters 205, 215, 225 and 235 and signals MODE and XMODE are omitted, data information can be shifted in only the vertical direction.

Figure 4:
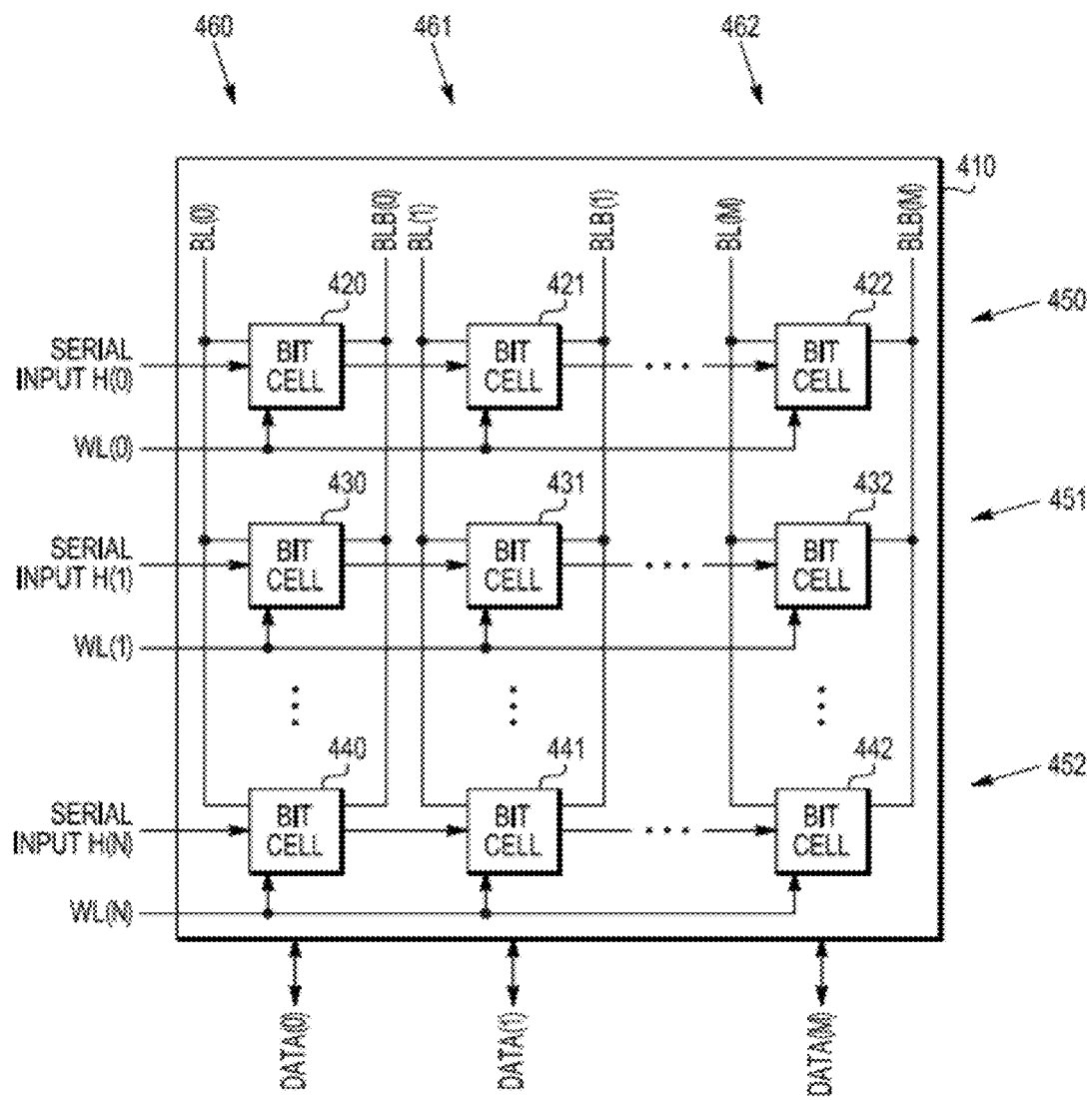
FIG. 4 is a block diagram illustrating another memory device including a bit cell array having shifting capability in accordance with a specific embodiment of the present disclosure.

FIG. 4 is a block diagram illustrating another memory device 400 including a bit cell array 410 having shifting capability in accordance with a specific embodiment of the present disclosure. Bit cell array 410 is similar to bit cell array 10 of FIG. 1 but bit cell array 410 is operable to shift data in only the horizontal (word line) direction and data can only be retrieved in a parallel manner.

Bit cell array 410 includes bit cells arranged in an orthogonal array including illustrated bit cells 420, 421, 422, 430, 431, 432, 440, 441, and 442. Bit cell array 410 includes a plurality of rows and columns, including rows 450, 451, and 452, and columns 460, 461, and 462.

Bit cells 420, 421 and 422 of row 450 are connected to a word line labeled WL(0), bit cells 430, 431 and 432 of row 451 are connected to a word line labeled WL(1), and bit cells 440, 441 and 442 of row 452 are connected to a word line labeled WL(N). Bit cells 420, 430 and 440 of column 460 are connected to bit lines labeled BL(0) and BLB(0), bit cells 421, 431 and 441 of column 461 are connected to bit lines labeled BL(1) and BLB(1), and bit cells 422, 432 and 442 of column 462 are connected to bit lines labeled BL(M) and BLB(M) Furthermore, each bit cell is connected to the next horizontally adjacent bit cell (in the word line direction). For example, bit cell 420 is connected to bit cell 421.

Each row of bit cell array 410 has an input to receive data that can be shifted into bit cell array 410 in a serial manner. Bit cell 420 has an input connected to a node labeled SERIAL INPUT H(0). Bit cell 430 has an input connected to a node labeled SERIAL INPUT H(1). Bit cell 440 has an input connected to a node labeled SERIAL INPUT H(N). A plurality of bits of data information can be stored simultaneously and retrieved simultaneously from memory device 400 via data lines DATA(0-M) by suitably configuring word lines WL(0-N) and bit lines BL(0-M) and BLB(0-M). The operation of bit cell array 410 will be better understood with reference to FIG. 5

Figure 5:
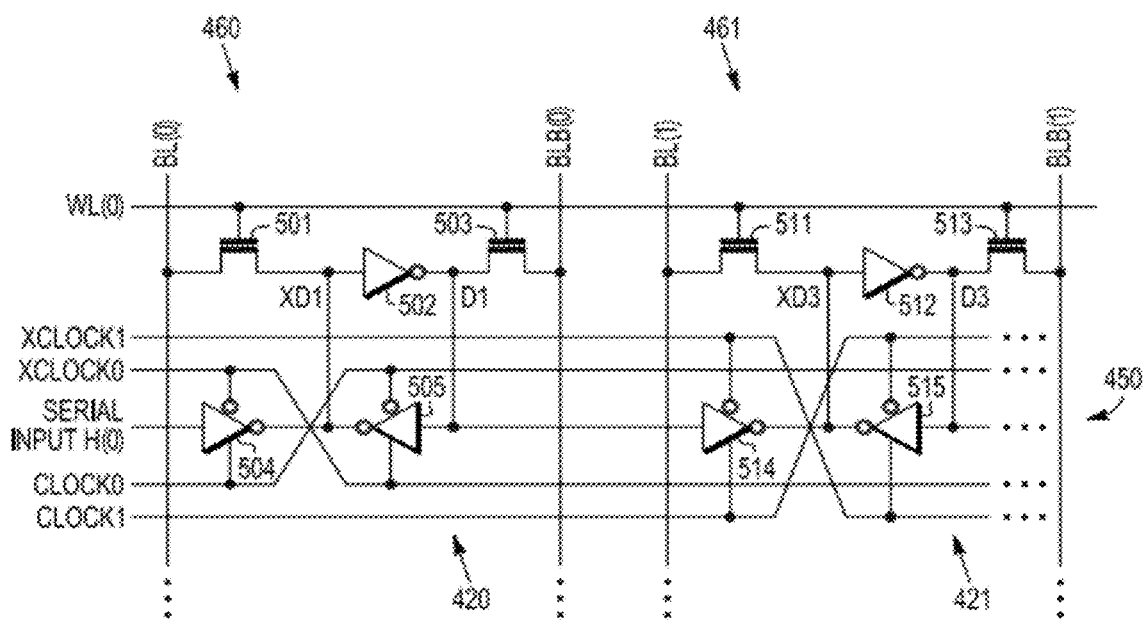
FIG. 5 is a schematic diagram illustrating a portion of the bit cell array of FIG. 4 in accordance with a specific embodiment of the present disclosure.

FIG. 5 is a schematic diagram illustrating a portion 500 of bit cell array 410 of FIG. 4 in accordance with a specific embodiment of the present disclosure. Portion 500 includes bit cell 420 and bit cell 421 of row 450. Bit cell 420 includes tri-state inverters 504 and 505, inverter 502, and transistors 501 and 503. Bit cell 421 includes tri-state inverters 514 and 515, inverter 512, and transistors 511 and 513. Bit cell 420 and bit cell 421 each include a single latch circuit and does not include a slave latch circuit. Because bit cells at bit cell array 410 do not include a slave latch circuit, data information cannot be shifted out of bit cell array 410, and can instead be retrieved from each respective bit cell in a parallel manner via corresponding bit lines.

Transistor 501 has a first current electrode connected to a node labeled BL(0), a control electrode connected to a node labeled WL(0), and a second current electrode connected to a node labeled XD1. Inverter 502 has an input connected to node XD1 and an output connected to a node labeled D1. Transistor 503 has a first current electrode connected to a node labeled BLB(0), a control electrode connected to a node labeled WL(0), and a second current electrode connected to a node labeled D1. Tri-state inverter 504 has an active-low tri-state enable input connected to a node labeled XCLOCK0, a data input connected to a node labeled SERIAL INPUT H(0), an active-high tri-state enable input connected to a node labeled CLOCK0, and an inverting output connected to node XD1. Tri-state inverter 505 has an active-low tri-state enable input connected to node CLOCK0, a data input connected to node D1, an active-high tri-state enable input connected to node XCLOCK0, and an inverting output connected to node XD1.

Transistor 511 has a first current electrode connected to a node labeled BL(1), a control electrode connected to a node labeled WL(0), and a second current electrode connected to a node labeled XD2. Inverter 512 has an input connected to node XD2 and an output connected to a node labeled D2. Transistor 513 has a first current electrode connected to a node labeled BLB(1), a control electrode connected to a node labeled WL(0), and a second current electrode connected to a node labeled D2. Tri-state inverter 514 has an active-low tri-state enable input connected to a node labeled XCLOCK1, a data input connected to node D1, an active-high tri-state enable input connected to a node labeled CLOCK1, and an inverting output connected to node XD2. Tri-state inverter 515 has an active-low tri-state enable input connected to node CLOCK1, a data input connected to node D2, an active-high tri-state enable input connected to node XCLOCK1, and an inverting output connected to node XD2.

Inverter 502 and tri-state inverter 505 form a latch circuit. During operation, information can be stored at the latch circuit using one of two methods: 1) parallel access; 2) serial row access (shifting horizontally to the right in the word line direction).

Bit cells 420 and 421 can be accessed in parallel by asserting word line signal WL(0). For example, data information can be stored at bit cell 420 by providing the desired value to be stored at node BL(0) and the inverse of that value at node BLB(0). The value stored at bit cell 420 can be retrieved by asserting word line signal WL(0) and sensing voltage signals received at nodes BL(0) and BLB(0). In the illustrated embodiment, signals CLOCK(1-0) are negated and signals XCLOCK(1-0) are asserted during a parallel access.

Data information can be shifted into bit cell 420 from node SERIAL INPUT H(0) (and the value stored at bit cell 420 shifted horizontally substantially simultaneously to bit cell 421) by asserting signal CLOCK0 and negating signal XCLOCK0 at tri-state inverter 504. When signal CLOCK0 is negated and signal XCLOCK0 is asserted, tri-state inverter 505 refreshes the value stored at the master latch node XD1. The operation of bit cell 421 is similar to that just described with reference to bit cell 420, with the exception of from where input data information is received. For example, bit cell 421 receives data information from bit cell 420 (node D1) instead of from node SERIAL INPUT H(0). Furthermore, bit cell 421 is updated in response to transitions of signals CLOCK1 and XCLOCK1 instead of transitions of signals CLOCK0 and XCLOCK0. Horizontally adjacent bit cells receive clock signals CLOCK0/XCLOCK0 or CLOCK1/XCLOCK1 in an alternating fashion so that any two horizontally adjacent bit cells are updated using different clock signals. For example, a third bit cell (not shown) adjacent to, and to the right of, bit cell 421 would receive clock signals CLOCK0 and XCLOCK0. The need for alternating clock signals used at adjacent bit cells can be better understood with reference to the timing diagram at FIG. 6.

Figure 6:
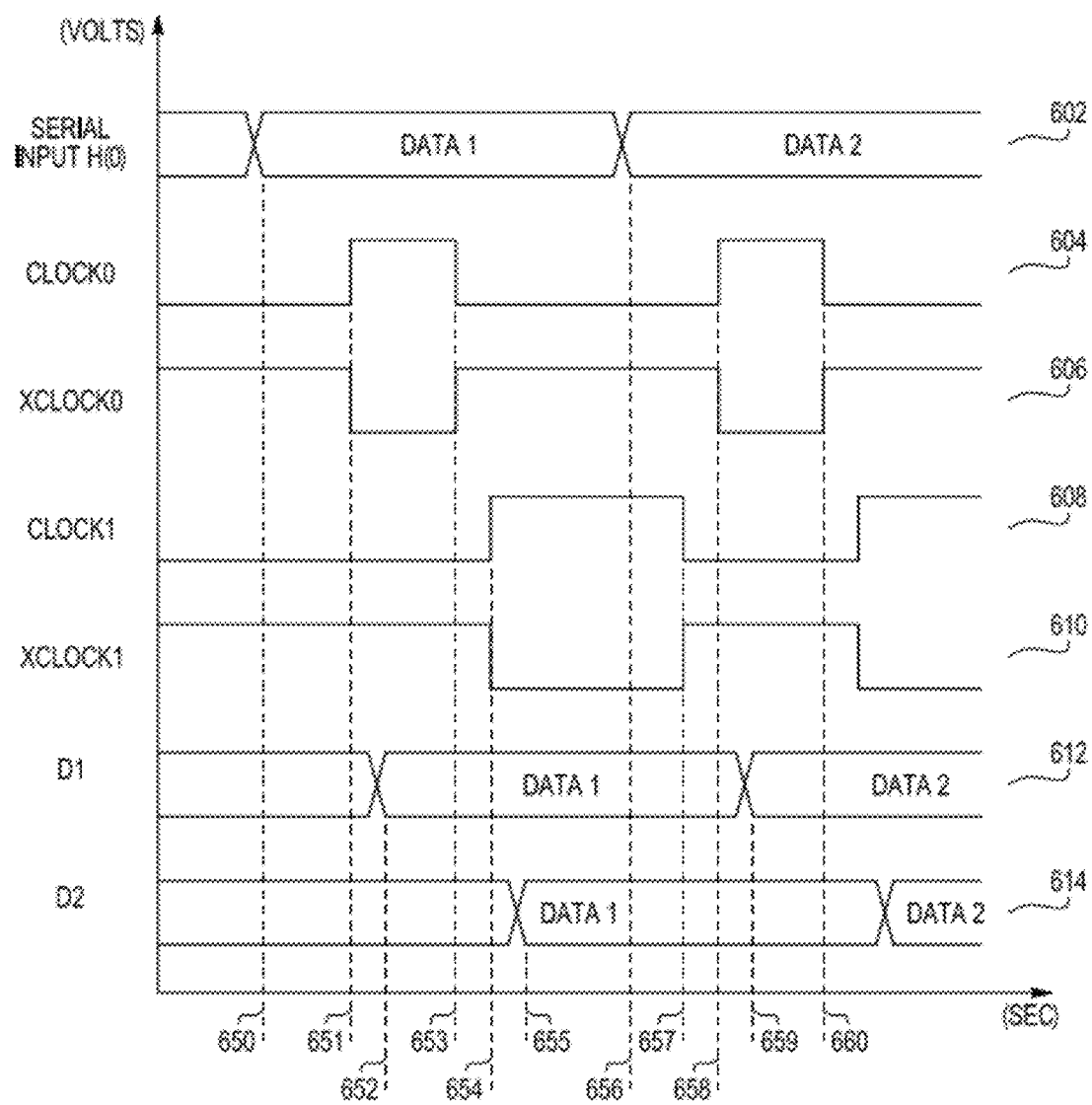
FIG. 6 is a timing diagram illustrating the operation of the bit cell array of FIG. 5 in accordance with a specific embodiment of the present disclosure.

FIG. 6 is a timing diagram 600 illustrating the operation of bit cell array 400 of FIG. 4 in accordance with a specific embodiment of the present disclosure. Timing diagram 600 includes a horizontal axis representing time in seconds, and a horizontal axis representing signal levels in volts. Timing diagram 600 includes a waveform 602 representing signal SERIAL INPUT H(0), a waveform 604 representing signal CLOCK0, a waveform 606 representing signal XCLOCK0, a waveform 608 representing signal CLOCK1, a waveform 610 representing signal XCLOCK1, a waveform 612 representing signal D1, and a waveform 614 representing signal D2. Timing diagram 600 also includes time references 650, 651, 652, 653, 654, 655, 656, 657, 658, 659, and 660.

Timing diagram 600 illustrates sequentially shifting two bits of data information into bit cells 420 and 421 at row 50 of bit cell array 400. At time 650, signal SERIAL INPUT H(0) transitions to a value labeled DAT1 (representing a single bit of binary data information having a value of one or a value of zero). At time 651, signal CLOCK0 transitions to a logic high level and signal XCLOCK0 transitions to a logic low level. The output of tri-state inverter 504 is thus enabled to drive node XD1 with a signal that represents the inverse of the value of DAT1. At time 652, this signal has propagated to node D1. At time 653, signal CLOCK0 transitions to a logic low level and signal XCLOCK0 transitions to a logic high level, whereby the output of tri-state inverter 504 is disabled (set to a high-impedance state) and the output of tri-state inverter 505 is enabled to refresh node XD1. At time 654, signal CLOCK1 transitions to a logic high level and signal XCLOCK1 transitions to a logic low level. The output of tri-state inverter 514 is thus enabled to drive node XD2 with a signal that represents the inverse of the value at node D1. At time 655, this signal has propagated to node D2. At time 657, signal CLOCK1 transitions to a logic low level and signal XCLOCK1 transitions to a logic high level, whereby the output of tri-state inverter 514 is disabled and the output of tri-state inverter 515 is enabled to refresh node XD2.

At time 656 node SERIAL INPUT H(0) transitions to a value labeled DATA2, and at time 658, signal CLOCK0 is again asserted, updating bit cell 420 with the value DATA2 at time 659. At time 660, signal CLOCK0 transitions to a logic low level and signal XCLOCK0 transitions to a logic high level, whereby the output of tri-state inverter 504 is disabled and the output of tri-state inverter 505 is enabled to refresh node XD1. Thus, at time 660, bit cell 421 is storing the value DAT1 and bit cell 420 is storing the value DATA2. Additional bits of data information can be shifted into row 450 in a similar manner Note that data information stored at bit cells 420 and 421 can be retrieved substantially simultaneously by asserting signal WL(0) whereby data information stored at each bit cell can be accessed via corresponding bit lines associated with each bit cell.

Figure 7:
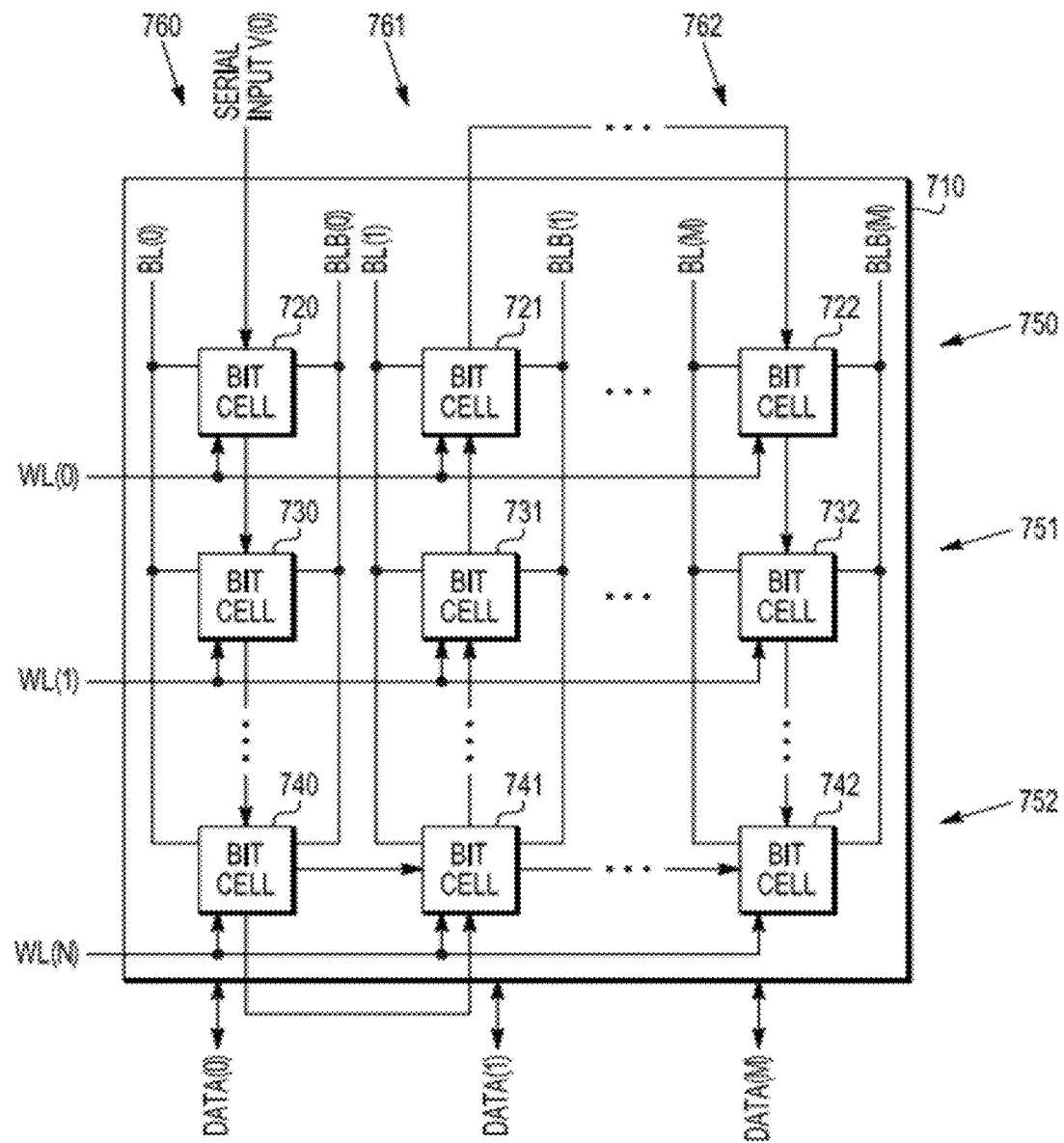
FIG. 7 is a block diagram illustrating another memory device including a bit cell array having shifting capability in accordance with a specific embodiment of the present disclosure.

FIG. 7 is a block diagram illustrating another memory device 700 including a bit cell array 710 having shifting capability in accordance with a specific embodiment of the present disclosure. Bit cell array 710 is similar to bit cell array 10 of FIG. 1 with the exception that shifting is provided in only a vertical (bit line) direction and data can only be retrieved in a parallel manner Bit cell array 710 includes bit cells arranged in an orthogonal array including illustrated bit cells 720, 721, 722, 730, 731, 732, 740, 741, and 742. Bit cell array 710 includes a plurality of rows and columns, including rows 750, 751, and 752, and columns 760, 761, and 762. The number of bit cells, rows, and columns can be selected based on the specific requirements of a data processing device that includes memory device 700. The connectivity of each bit cell of bit cell array 710 is similar to that described with reference to FIG. 4 with the exception that vertically adjacent bit cells are connected to enable shifting of data in a vertical direction. Furthermore, bit cell 710 has an input to receive serial data information via a signal labeled SERIAL INPUT V(0). Note that the bit cells included at column 760 are interconnected so that shifting occurs in a downward vertical direction and that the bit cells included at column 761 are interconnected so that shifting occurs in an upward vertical direction. By configuring bit cells located at alternating columns to shift in opposite directions, individual columns can be interconnected in a daisy-chain manner, as shown at FIG. 7, so that data information can be sequentially shifted into all bit cells at bit cell array 710 from a single serial input. The operation of bit cell array 710 can be better understood with reference to FIG. 8.

Figure 8:
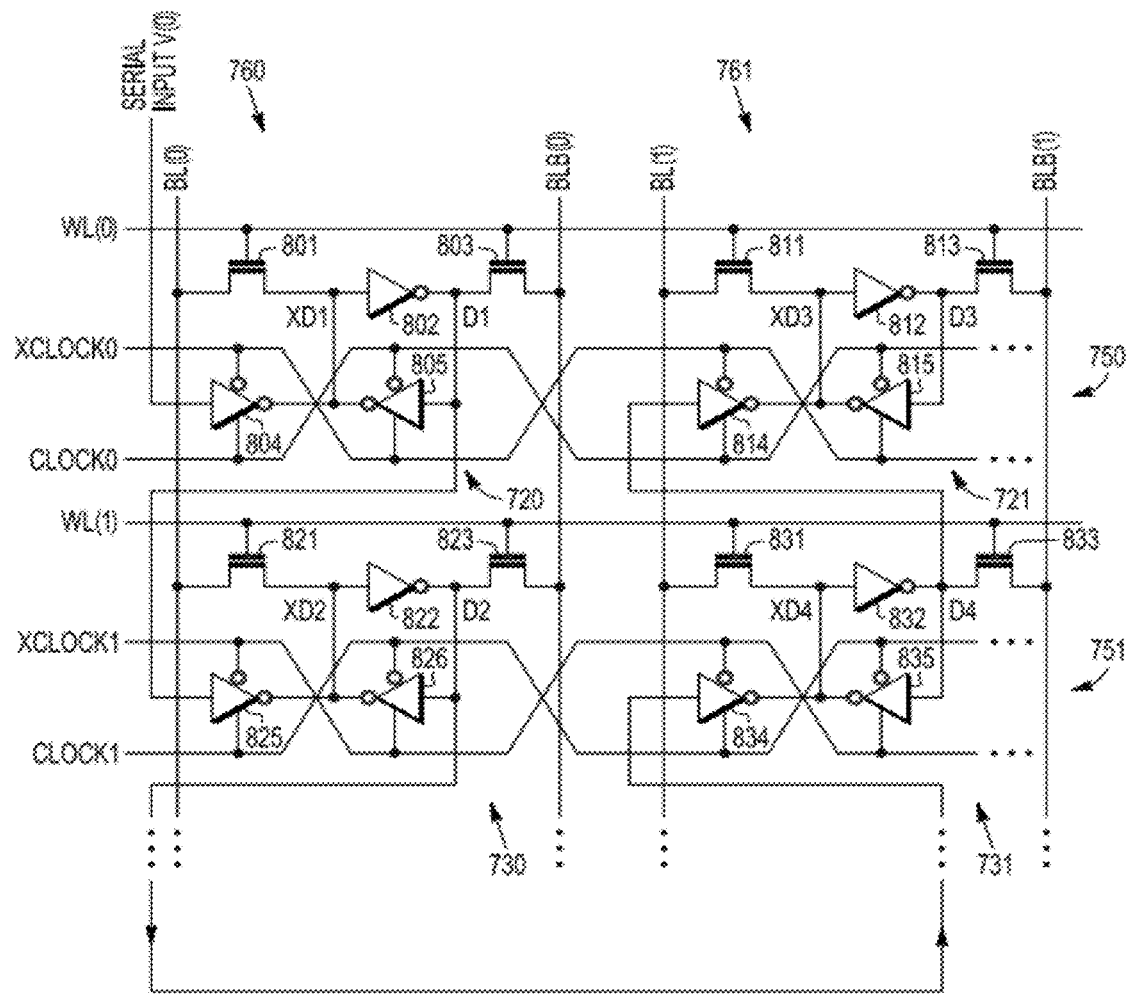
FIG. 8 is a schematic diagram illustrating a portion of the bit cell array of FIG. 7 in accordance with a specific embodiment of the present disclosure.

FIG. 8 is a schematic diagram illustrating a portion 800 of bit cell array 710 of FIG. 7 in accordance with a specific embodiment of the present disclosure. Portion 800 includes bit cell 720 and bit cell 721 of row 750, and bit cell 730 and bit cell 731 of row 751. The connectivity of bit cells included at portion 800 is similar to that described with reference to FIG. 5, with the exception that vertically adjacent bit cells (bit cells connected to the same bit line) are connected to enable shifting of data in a vertical direction. For example, information stored at bit cell 720 can be shifted in a downward vertical direction into bit cell 730, and information stored at bit cell 731 can be shifted in an upward vertical direction into bit cell 721. Because bit cells at bit cell array 710 do not include a slave latch circuit, data information cannot be shifted out of bit cell array 710, and is instead retrieved from each respective bit cell in a parallel manner via corresponding bit lines.

Figure 9:
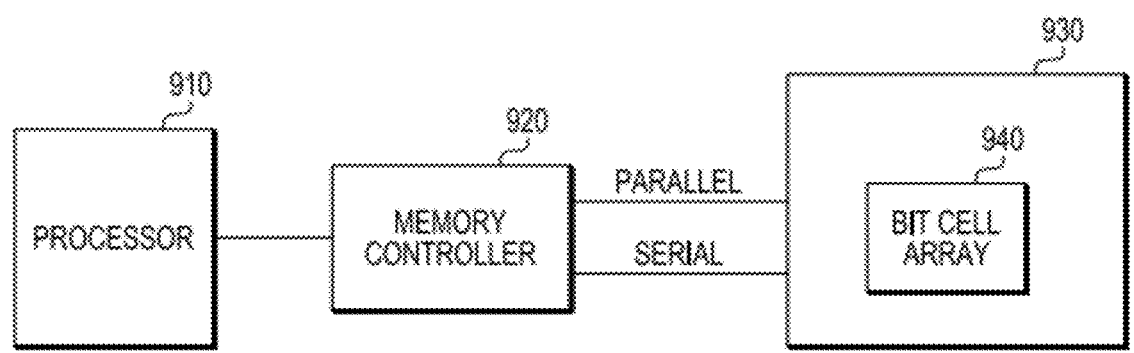
FIG. 9 is a block diagram illustrating a data processing device including a memory device having shifting capability in accordance with a specific embodiment of the present disclosure.

FIG. 9 is a block diagram illustrating a data processing device 900 including a memory device having shifting capability in accordance with a specific embodiment of the present disclosure. Data processing device includes a processor 910, a memory controller 920, and a memory device 930. Memory device 930 includes a bit cell array 940. Bit cell array 940 can represent bit cell array 10 of FIG. 1.

Processor 910 is connected to memory controller 920. Memory controller 920 is configured to access memory device 930 in response to memory access requests received from processor 910. Memory controller 920 is connected to memory device via a bidirectional interface labeled PARALLEL and another bidirectional interface labeled SERIAL. During operation, memory controller 920 can store or retrieve data information at bit cell array 940 of memory device 930 in a serial manner via the SERIAL interface or in a parallel manner via the PARALLEL interface. In another embodiment, bit cell array 940 may represent bit cell array 410 of FIG. 4 or bit cell array 710 of FIG. 7, in which case memory controller 920 can store and retrieve data information at memory device 930 in a parallel manner, or store (but not retrieve) data information at memory device 930 in a serial manner.

For example, the bit cells of bit cell array 940 can be arranged in a plurality of rows and a plurality of columns, where each row is associated with a memory address. To store information at the bit cell array 940, the processor 910 communicates a memory address and the data to be stored to memory controller 920. In response, memory controller 920 selects the row of bit cell array 940 associated with the address and stores the information at the selected row using a parallel access. In response to receiving a request from the processor 910 to shift data stored at the bit cell array 940, the memory controller 920 provides control and clock signals via the SERIAL interface to shift stored data along one or more rows or one or more columns of the array.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising,
receiving first information at a memory array comprising a plurality of bit cells arranged in a plurality of rows and a plurality of columns, each of the plurality of rows associated with a corresponding word line and each of the plurality of columns associated with a corresponding bit line;
storing the first information via a first parallel access to a first row of the memory array; and
serially shifting second data information from a first subset of the plurality of bit cells to a second subset of the plurality of bit cells.

2. The method of claim 1, wherein shifting comprises shifting the second data information along a first row of the memory array.

3. The method of claim 1, wherein shifting comprises shifting the second data information along a column of the memory array.

4. The method of claim 1, wherein shifting comprises shifting a first portion of the second data information along a first row of the memory array, and shifting a second portion of the second data information from the first row to a second row of the memory array.

5. The method of claim 1, wherein shifting comprises shifting a first portion of the second data information along a first column of the memory array, and shifting a second portion of the second data information from the first column to a second column of the memory array.

6. The method of claim 1, further comprising serially shifting third data information from a third subset of the plurality of bit cells to a fourth subset of the plurality of bit cells and wherein:
shifting the second data information comprises shifting the second data information along a row of the memory array; and
shifting the third data information comprises shifting the third data information along a column of the memory array.

7. The method of claim 1, further comprising:
receiving a first address;
selecting a first row of the memory array based on the first address and storing third information at the first row via a second parallel access;
receiving a second address;
selecting a second row of the memory array based on the second address and retrieving fourth information from the second row via a third parallel access.

8. A method, comprising:
receiving first information at a memory array comprising a plurality of bit cells arranged in a plurality of rows and a plurality of columns, where each of the plurality of rows is associated with a corresponding word line and each of the plurality of columns is associated with a corresponding bit line;
storing the first information at a first row of the memory array via a parallel access by providing the first information via a plurality of bit lines associated with the first row; and;
shifting second information stored at a first subset of the plurality of bit cells of the memory array to a second subset of the plurality of the bit cells.

9. The method of claim 8, wherein the first subset of the plurality of bit cells and the second subset of the plurality of bit cells are located on a common row of the memory array.

10. The method of claim 8, wherein the first subset of the plurality of bit cells and the second subset of the plurality of bit cells are associated with a common column of the memory array.

11. The method of claim 8, wherein shifting comprises:
in response to a first transition of a clock signal, shifting third data information from a master module of a first bit cell of the first subset of the plurality of bit cells to a slave module of the first bit cell.

12. The method of claim 11, wherein shifting further comprises:
in response to a second transition of the clock signal, shifting the third data information from the slave module of the first bit cell to a master module of a second bit cell of the first subset of the plurality of bit cells.

13. A memory array, comprising:
a plurality of bit cells arranged in a plurality of rows and a plurality of columns, each of the plurality of rows associated with a corresponding word line and each of the plurality of columns associated with a corresponding bit line, the memory array operable to store information in a parallel manner at a row of the memory array;
each bit cell of at least a subset of the plurality of bit cells configured to receive information from another bit cell of the plurality of bit cells during a shift operation.

14. The memory array of claim 13, wherein each bit cell of the subset of the plurality of bit cells is configured to receive information from another bit cell on the same row of the memory array during a shift operation.

15. The memory array of claim 14, wherein each bit cell of the subset of the plurality of bit cells is configured to receive information from an adjacent bit cell of the memory array during a shift operation.

16. The memory array of claim 13, wherein each bit cell of the subset of the plurality of bit cells is configured to receive information from another bit cell on the same column of the memory array during a shift operation.

17. The memory array of claim 13, wherein each bit cell of the subset of the plurality of bit cells is configured to selectively receive information from another bit cell on the same row of the memory array or from another bit cell on the same column of the memory array during a shift operation depending on a type of the shift operation.

18. The memory array of claim 13, wherein one of the subset of the plurality of bit cells comprises:
a first input to receive a clock signal during the first shift operation;
a master latch;
a slave latch coupled to the master latch, the slave latch operable to store data information stored at the master latch in response to a first edge of the clock signal.

19. The memory array of claim 18, wherein the slave latch is operable to provide data information stored at the slave latch to another bit cell in response to a second edge of the clock signal.

20. The memory array of claim 13, wherein one of the subset of the plurality of bit cells comprises a first input/output port coupled to a first bit line of the memory array, and a second output coupled to a second of the subset of the plurality of bit cells.

* * * * *